United States Patent
Gessner et al.

(10) Patent No.: US 10,217,890 B2
(45) Date of Patent: Feb. 26, 2019

(54) INTEGRATED MEASURING SYSTEM FOR THE SPECTRAL MEASURING TECHNIQUE

(71) Applicant: Fraunhofer-Gesellschaft zur Förderung der angewandten Forschung e.V., München (DE)

(72) Inventors: Thomas Gessner, Chemnitz (DE); Thomas Otto, Taura (DE); Jörg Martin, Burkhardtsdorf (DE); Alexander Weiss, Chemnitz (DE)

(73) Assignee: Fraunhofer-Gesellschaft zur Förderung der angewandten Forschung e.V., München (DE)

( * ) Notice: Subject to any disclaimer, the term of this patent is extended or adjusted under 35 U.S.C. 154(b) by 0 days.

(21) Appl. No.: 15/311,746

(22) PCT Filed: May 15, 2015

(86) PCT No.: PCT/EP2015/060797
§ 371 (c)(1),
(2) Date: Nov. 16, 2016

(87) PCT Pub. No.: WO2015/173414
PCT Pub. Date: Nov. 19, 2015

(65) Prior Publication Data
US 2017/0084776 A1    Mar. 23, 2017

(30) Foreign Application Priority Data

May 16, 2014 (DE) .......... 10 2014 209 385
Oct. 23, 2014 (DE) .......... 10 2014 221 525

(51) Int. Cl.
*H01L 31/12* (2006.01)
*H01L 31/16* (2006.01)
(Continued)

(52) U.S. Cl.
CPC ........ *H01L 31/173* (2013.01); *H01L 27/3227* (2013.01); *H01L 31/035218* (2013.01);
(Continued)

(58) Field of Classification Search
CPC ..... H01L 31/173; H01L 31/16; H01L 31/125; H01L 51/502; H01L 27/3227; H01L 31/035218; H01L 33/06
(Continued)

(56) References Cited

U.S. PATENT DOCUMENTS 5,293,050 A    3/1994   Chapple-sokol et al.
2005/0236556 A1    10/2005   Sargent et al.
(Continued)

FOREIGN PATENT DOCUMENTS

CN    104409475 A    3/2015
JP    2013110258 A    6/2013
(Continued)

OTHER PUBLICATIONS

"International Application No. PCT/EP2015/060797, International Search Report dated Jul. 9, 2015", w/ English Translation, (Jul. 9, 2015), 5 pgs.
(Continued)

*Primary Examiner* — Robert T Huber
(74) *Attorney, Agent, or Firm* — Schwegman Lundberg & Woessner, P.A.

(57) ABSTRACT

A measuring system comprises a substrate (IO), which has a quantum dot layer, which is arranged on the substrate and which comprises an emission segment having a first plurality of quantum dots, which first plurality has an average first energy gap, wherein the first plurality can emit radiation corresponding to the average first energy gap, wherein the quantum dot layer comprises at least one absorption segment having a laterally located second plurality of quantum dots (Continued)

Figure 1A:
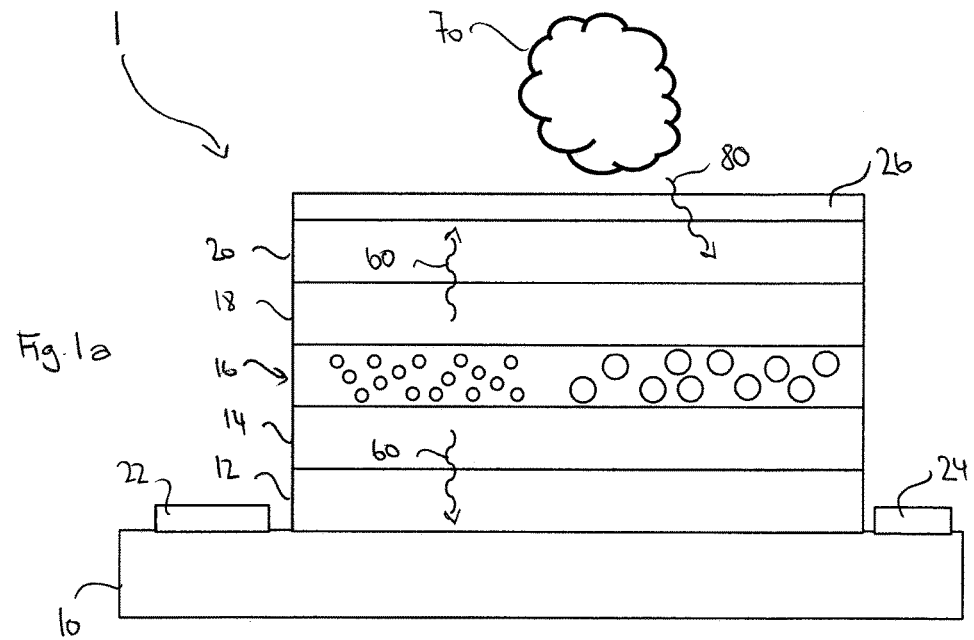

and the second plurality has an average second energy gap that is less than the average first energy gap so that radiation emitted by the emission segment can be absorbed by the at least one absorption segment.

20 Claims, 4 Drawing Sheets

(51) Int. Cl.
*H01L 33/06* (2010.01)
*H01L 51/42* (2006.01)
*H01L 51/50* (2006.01)
*H01L 31/173* (2006.01)
*H01L 31/0352* (2006.01)
*H01L 27/32* (2006.01)

(52) U.S. Cl.
CPC ............ *H01L 31/125* (2013.01); *H01L 31/16* (2013.01); *H01L 33/06* (2013.01); *H01L 51/426* (2013.01); *H01L 51/502* (2013.01); *Y02E 10/549* (2013.01)

(58) Field of Classification Search
USPC ..................................... 257/40, 431, E31.096
See application file for complete search history.

(56) References Cited

U.S. PATENT DOCUMENTS

| 2010/0029026 | A1 | 2/2010 | Berger et al. |
| 2014/0061486 | A1 | 3/2014 | Bao et al. |
| 2014/0061679 | A1* | 3/2014 | Guo ...................... H01L 31/173 257/84 |

FOREIGN PATENT DOCUMENTS

| WO | WO-2007112088 A2 | 10/2007 |
| WO | WO-2013126548 A2 | 8/2013 |

OTHER PUBLICATIONS

"International Application No. PCT/EP2015/060797, Written Opinion dated Jul. 9, 2015", (Jul. 9, 2015), 9 pgs.

* cited by examiner

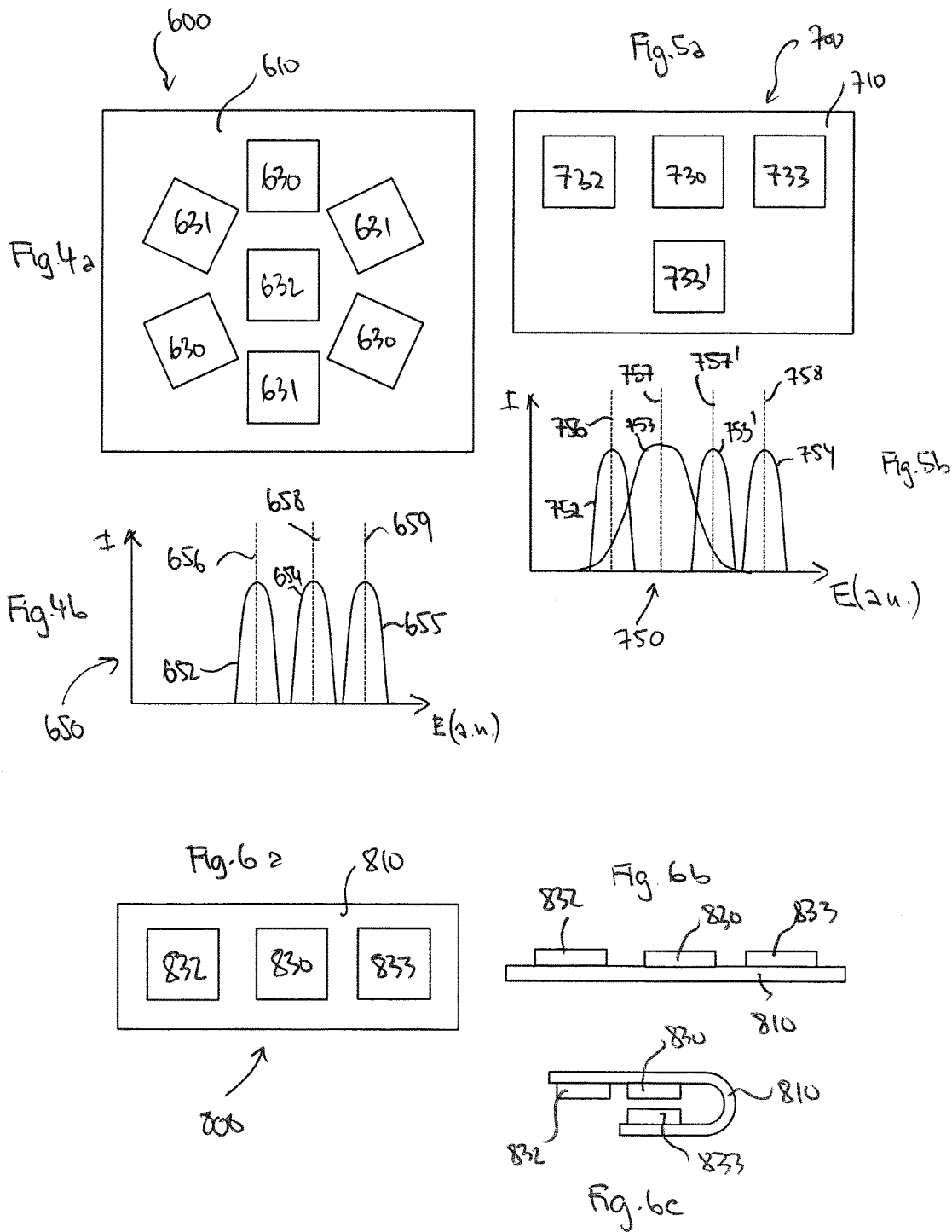

INTEGRATED MEASURING SYSTEM FOR THE SPECTRAL MEASURING TECHNIQUE

PRIORITY APPLICATIONS

This application is a U.S. National Stage Filing under 35 U.S.C. 371 from International Application No. PCT/EP2015/060797, filed on 15 May 2015, and published as WO2015/173414 on 19 Nov. 2015, which claims the benefit of priority to German Application No. 10 2014 221 525.0, filed on 23 Oct. 2014 and to German Application No. 10 2014 209 385.6, filed on 16 May 2014; which applications and publication are incorporated herein by reference in their entirety.

The subject-matter of the present invention is a measuring system according to the preamble of claim 1.

A quantum dot is a nanoscopic material structure which, given an electrical excitation corresponding to its band gap, emits photons due to the production of election-hole pairs. Accordingly, electron-hole pairs can be produced given the incidence of photons onto the nanoscopic material structure. In this manner, it is possible to create emitting elements such as LEDs for example, and detecting elements such as photo-detectors for example, on the basis of quantum dots. The application of quantum dots in measuring technology has not been known until now.

It is the object of the present invention, to provide a measuring system which is simply constructed and which can be simply manufactured.

This object is achieved by a measuring system according to the features of claim 1, as well as by a manufacture of such a measuring system.

Optical measuring technology in the form of spectral sensors, optical light barriers or distance sensors is quite widespread in many technical fields, such as analytical measuring technology, quality assurance, information technology or security technology for example. It is particularly spectral measuring technology which is highly significant here, due to the fact that important information regarding the quantitative and qualitative composition of materials themselves can be obtained by way of the reflection and transmission characteristics of these materials to be examined.

For the most part, spectral sensors are manufactured from a multitude of optical components, such as light sources (solid-state semiconductors, thermal emitters, detectors) and further imaging and shaping elements (lenses, mirrors, adjustment devices).

Established spectral measuring appliances can be subdivided into dispersive, non-dispersive spectrometers, as well as spectrometers based on interferometry. These spectrometers however are not suitable as would be necessary with a flexible, inexpensive, sensory application, for example in process measuring technology, in the field of condition and health monitoring or consumer or food applications, due to the comparatively high price and the external dimensions and the complicated construction.

Approaches to finding a solution have been attempted with miniaturised and inexpensively manufacturable spectrometers based on micro-system technology, wherein it is particularly semiconductors, light diodes and photodiodes which are discussed here. These however entail relatively complicated manufacturing technologies and thus higher costs.

The measuring system which is suggested here overcomes some of the difficulties discussed above. The measuring system comprises a substrate with a quantum dot layer arranged on the substrate. According to the invention, it is suggested that the measuring system comprises a quantum dot layer which comprises at least one (in some embodiments also exactly one) emission segment and at least one (in some embodiments also exactly one) absorption segment. The emission segment comprises a first multitude of quantum dots, wherein the first multitude has an average first energy gap, and a radiation corresponding to the average first energy gap can be emitted. The emission of radiation can be excited by way of an applied voltage for example. The emission segment is suitable for emitting radiation, for example in the optical region, the middle to near infrared region or soft UV region.

The absorption segment comprises a second multitude of quantum dots, wherein the second multitude has an average second energy gap which is smaller than the average first energy gap, so that radiation emitted by the emission segment is absorbable by the absorption segment after interaction with the surroundings or a measured object.

A multitude of quantum dots has a common spectrum, i.e. an energy distribution, mostly in the form of a Gaussian curve. This for example reflects the Gaussian size distribution of the quantum dots of the respective emission or absorption segment, about a statistically frequently occurring value. From here on, the energy at which the spectrum has a maximum is indicated as the average energy gap. The Gaussian distribution has a narrower or wider distribution, depending on how the size of the individual quantum dots is distributed in the respective emission segment or absorption segment. Here, the "full width at half maximum" (FWHM) can be used as a criterion, in order to characterise the emission and/or absorption spectra more closely.

It is ensured that radiation emitted by the emission segment can be absorbed by the quantum dots of the absorption segment due to the fact that the average first energy gap, i.e. the energy gap of the emission segment is larger than the average second energy gap, i.e. the energy gap of the absorption segment.

Quantum dots of different materials or sizes can be used to set the average energy gap of the absorption segment or emission segment. For example, one falls back on different materials for the quantum dots of the different segments, in various embodiments of the invention, wherein the different materials produce different average energy gaps. In other embodiments, it is possible to use the same material for the quantum dots of the absorption segment and emission segment, and to set the average energy gap via the size distribution of the quantum dots in the respective segment.

Energy distributions which have more than one maximum can also be set for example, by way of varying the material composition of the emission segment and/or absorption segment. An energy value of a (smoothed) energy distribution which lies shifted to an average energy gap, at least for example by an energy value corresponding to the width of the FWHM, is here considered as a maximum. The one or the other maximum can then be excited into emission in each case by way of applying a suitable control voltage, on account of a mixing of materials within a segment, so that an energy distribution with two different maxima results. As the case may be, both energy gaps can also be influenced by way of a suitable variation of the electrical field. In an embodiment, with an energy distribution of the emission segment with more than one average energy gap, the second average energy gap of the absorption segment is smaller than the energy gap of the energy richer maximum. In other embodiments, the second average energy gap is smaller than the energy poorest maximum of the emission segment. With regard to the cases of an energy distribution with more than one maximum, the term average energy gap can also be replaced by an energy gap, at which the energy distribution has a (in some embodiments local) maximum. In the cases, in which the absorption segment has an energy distribution with more than one maximum, the energy richest maximum can be smaller that the energy richest maximum of the emission segment or alternatively smaller that the energy poorest emission spectrum of the emission segment, in some embodiments.

The emission segment and the absorption segment are preferably each simply coherent, i.e. taken per se they form a coherent surface which for example are adjacent one another or are distanced to one another by a section of the quantum dot layer which is free of quantum dots. The quantum-dot-free section can have a width for example which is comparable to the emission segment or absorption segment, but can also be reduced to a smaller width. A coherent segment moreover simplifies the electrical activation of the individual segments.

In an embodiment, the emission segment and the absorption segment are arranged to one another on the substrate, in a manner such that most of the radiation emitted by the emission segment firstly interacts with surroundings located outside the emission segment, such as a measured object or measured surroundings, and the radiation reflected or transmitted by the surroundings is absorbed by the absorption segment. This for example can be realised by way of an optically absorbing or non-transparent layer between the emission segment and the absorption segment, or by way of a suitable spacing between the emission segment and absorption segment. The region lying between the emission segment and the absorption segment is designed in a manner such that radiation emitted directly onto the absorption segment by the emission segment only insignificantly adulterates a measurement. Optically non-transparent, isolating and absorbing is here to be understood in that the radiation of the average energy of the emission segment is reflected, completely absorbed and partly absorbed respectively, by way of the optically non-transparent, isolating or absorbing layer or region, so that the greater part of the radiation which is incident upon the absorption segment is only incident after interacting with the surroundings.

The quantum dot layer for example can comprise quantum dots which emit at energies between 0.2 and 4 eV, depending on the size and the material. Nano-crystals with at least one shell of the semiconductor materials CdSe, CdTe, CdS, GaAs, GaSb, HgTe, InAs, InP, InSb, PbSe, PbS, PbTe, ZnS, ZnSe, ZnTe, Ge, ZnO or Si can be quantum dots for example. A quantum dot for example is constructed of a core/shell combination CdSe/CdS or InP/ZnS.

As mentioned above, an energy distribution of a multitude of quantum dots can have an average energy gap $E_{max}$ of between 0.2 eV and 4 eV. The FWHM $\Delta_{FWHM}$ of such an energy distribution can be absolutely between 10 meV and 2 eV. The ratio of the FWHM to the average energy gap of the energy distribution $\Delta_{FWHM}/E_{max}$ can lie between 0.005 and 0.5, in a further embodiment between 0.02 and 0.2 or 0.03 and 0.1 or 0.01 and 0.1.

The energy distributions of the first and second multitude of quantum dots can be designed differently to one another in different regions of the spectrum. Apart from the values or value intervals for $E_{max}$, $\Delta_{FWHM}$ or $\Delta E_{FWHM}/E_{max}$, which are described above, the first and second energy distribution can be designed in an overlapping manner in the visible spectrum, i.e. the distance of the average energy gaps of the first, second and or third or further energy gaps to one another is in the range of a few FWHM of the energy distributions, preferably less than 2 FHWM, and/or almost disjunct in the infrared region, i.e. the distance between two adjacent average energy gaps can be a multiple of the FWHM, for example 5 FHWM.

It is possible to provide a measuring system which is simple to manufacture, by way of the arrangement of the quantum dot layer on a substrate, by way of which system one can realise spectral sensors which for example can also be integrated on packaging for products such as perishable foodstuffs, and which render chemical and physical characteristics of the product permanently measurable. Spectral measuring technology, on account of the miniaturised construction manner of the measuring system, can be expanded to the extent that it represents a new class of filter spectrometers with settable parameters (i.e. the shape of the energy distribution of the emission and/or absorption segment) which can be changed in a direct manner for example in a printing or spraying process. The measuring systems described here can moreover be applied for the simultaneous manufacture of quantum dot emitters and detectors, also for light barriers or distance sensors.

Further embodiments are explained by way of the dependent claims.

In an embodiment of the measuring system, an optically isolating layer is present between the emission segment and the absorption segment. In this manner, one can ensure that radiation emitted by the emission segment is not emitted directly into the absorption segment, but only the emitted radiation which is reflected by an object to be measured is absorbed by the absorption segment. The influence of scatter radiation can be reduced or ruled out by way of the optically isolating layer. The optically isolating layer for example can be a layer such as a metallisation for example (for example of Ag) which is non-transparent in the region of the emitting radiation, or a non-transparent plastic such as a photoresist or a matrix with embedded graphite particles. The optically isolating layer can alternatively also absorb the radiation emitted by the emission segment directly onto the absorption segment, only to the extent that a measurement result which is rendered possible by radiation interacting with the surroundings and incident upon the absorption segment is not adulterated by the direct irradiation of the absorption segment by the emission segment, which is to say that the influence of the direct radiation can be clearly recognised and can be compensated, at least with regard to data technology.

In a further embodiment of the measuring system, the emission segment and the absorption segment are spatially separated from one another. What is to be understood by this is that the quantum dot layer only locally has an emission segment and an absorption segment distanced to this emission segment. A distance exists between these two segments, and this is selected in a manner such that the direct incidence of emitted radiation from the emission segment into the absorption segment is significantly reduced. In a variant, the emission segment and the absorption segment for example are arranged on a common substrate or carrier, with a substrate plane, and the absorption segment and the emission segment are spatially separated from one another within this plane. This for example can be achieved by way of the segments not being stacked upon one another on a substrate, but being arranged next to one another on the substrate.

In a further embodiment, the quantum dot layer comprises a matrix of an organic or inorganic, conductive or semi-conductive material, into which the quantum dots are embedded. Various thiophenes, BCP, TPD, CBP, PVK, but also composites with conductive particles and fibres such as TiO$_2$, ZTO, ZnS, ZnO, ITO, WO$_3$, MoO$_3$, NiO or graphene oxide can be used as possible matrix materials. Characteristics such as a high charge-carrier mobility, good processing ability, as well as chemical, thermal and electrical stability are important with regard to the section of the materials for the matrix. The physical characteristics of the matrix material should be adapted to the applied quantum dots. The position of the energy level of the matrix material should provide low thresholds for the direct injection of charge carriers, and the material should be transparent in the region of the average energy gap or of the energy distribution of the respective segment.

In a further embodiment, the measuring system comprises at least one charge transport layer. An electron transport layer (ETL) or a hole transport layer (HTL) can be provided as a charge transport layer. Here and in one variant, one envisages placing the quantum dot layer between two charge transport layers, for example an electron transport layer and a hole transport layer, herein, the quantum dot layer is directly adjacent the respective charge transport layer. In a further variant, the quantum dot layer can be integrated into the charge transport layer, wherein the matrix material of the quantum dot layer assumes the function of the electronic transport layer or hole transport layer. The material of the matrix is selected accordingly, in order to maintain the functionality of the charge transport layer. If CdSe is used as a material for the quantum dots for example, then ZnO as a material for the matrix of the quantum dot layer can also simultaneously serve as an electron transport layer.

In a further embodiment, one envisages the measuring system comprising a hole injection layer (HIL) and/or a hole blocking layer (HBL). Examples of such a layer for example are a HIL of GO or PEDOT:PSS or a HBL of ALq$_3$.

Various layers can be applied with the variants of the measuring system which are discussed here. Here, in one variant, a sandwich system with which the individual layers are successively deposited by way of methods known from the state of the art is preferred. Etching processes, sputtering processes or vapour processes, or spin-coating, vapour deposition, punched, printed or sprayed layers can be applied here for example. The number and the functionality of the applied layers depend on the preferred field of application of the measuring system. Moreover, it is possible to deposit the layers on a larger substrate and to singularise the substrate into individual measuring systems at a later stage. In some embodiments, the measuring system is smaller than 1 cm$^3$. Suitable layer dimensions for example are a layer thickness of 1 nm to 1200 nm, preferably less than 1000 nm. In numerous embodiments, the emission segment and the absorption segment are arranged next to one another, which is to say deposited next to one another, on the substrate. The layers which are necessary for the respective segment however can often be deposited simultaneously, in a layered manner.

In a further embodiment of the measuring system, one envisages a cathode and an anode being present. It is possible by way of the cathode and the anode, to apply control voltages to the emission segment and/or absorption segment, so that the respective segment can be used for emitting radiation and for detecting emitted radiation respectively. Herein, in one variant, one envisages the cathode or the anode being structured in a manner such that the emission segment and the absorption segment can be electrically influenced separately from one another. If an individual cathode-anode pair is assigned to the respective segment, then the control voltages for emitting or detecting radiation can be set in a particularly efficient manner. An electronic circuit which changes the control voltage according to a temporal pattern and thus permits an emission and a subsequent detection with an anode-cathode configuration can be present for example in the case of non-structured anodes or cathodes.

In a further embodiment of the measuring system, a further emission segment with an average third energy gap is present in the quantum dot layer, wherein the average third energy gap is than the average second energy gap of the absorption segment. Herein, in a variant, the average third energy gap can be selected in a manner such that this is different to the average first energy gap.

It is particularly with the use of a further emission segment, whose average energy gap differs from the average energy gap of the emission segment, that the object to be examined can be examined in different regions of the optical spectrum for example.

In a further embodiment, one envisages the quantum dot layer comprising a further absorption segment with an average fourth energy gap, and the fourth average energy gap being smaller or equal to the average second energy gap. The measuring accuracy and sensitivity of the measuring system can be better set by way of the use of different absorption segments with different average energy gaps. Thus for example an absorption segment with a specific spectral sensitivity can be used for determining the intensity of the emission segment, and a further absorption segment can be applied for determining the central wavelength of the emitting elements. Herein, the size distributions of the quantum dots can be selected differently for example, in order to thus set the width of the energy distribution, and the energy gap accordingly.

In a further embodiment, the measuring system comprises a substrate and/or an anode and/or a cathode which is optically transparent in the region of the emitted radiation. The direction, in which radiation is emitted onto the object to be measured, can be set more precisely in this manner. Moreover, one can envisage the measuring system being provided with pinholes, arranged on the substrate for example, and thus permitting a more precise projection of the emitted radiation.

In some embodiments, one can envisage the substrate being selected such that it is flexible or foldable. Various embodiments are possible here, so that a measuring system with two absorption segments and an emission segment for example can be applied in a manner such that the substrate, between the emission segment and an absorption segment, is folded in a manner such that the folded absorption segment is directly subjected to radiation by the emission segment, and thus characteristics of the emission segment, such as the intensity or the central wavelength for example can be determined, and the second absorption segment is configured in a manner such that this only receives emitted radiation of the emission segment which is reflected by a body/object. Numerous characteristics of the object to be measured can be determined from the combination of the radiation which is received by the two absorption segments.

Further details and embodiments are to be found in the figures described hereinafter. Here, it is to be mentioned that not only can the features described within the context of the figure be claimed in combination with the further features of the figure, but also in combination with features of other figures, or by themselves.

Figure 2A:
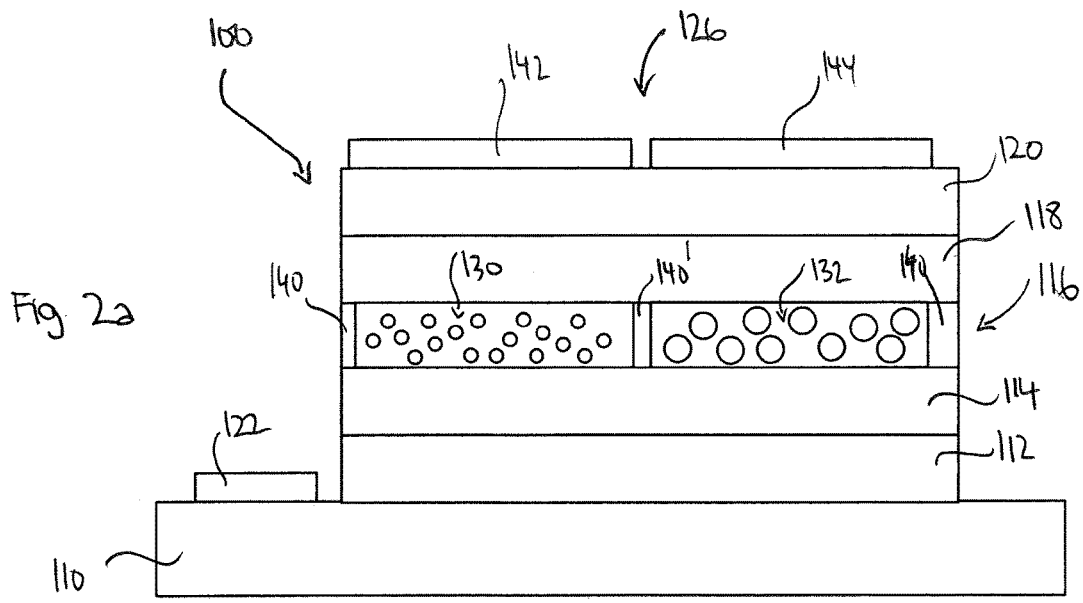
Figure 2B:
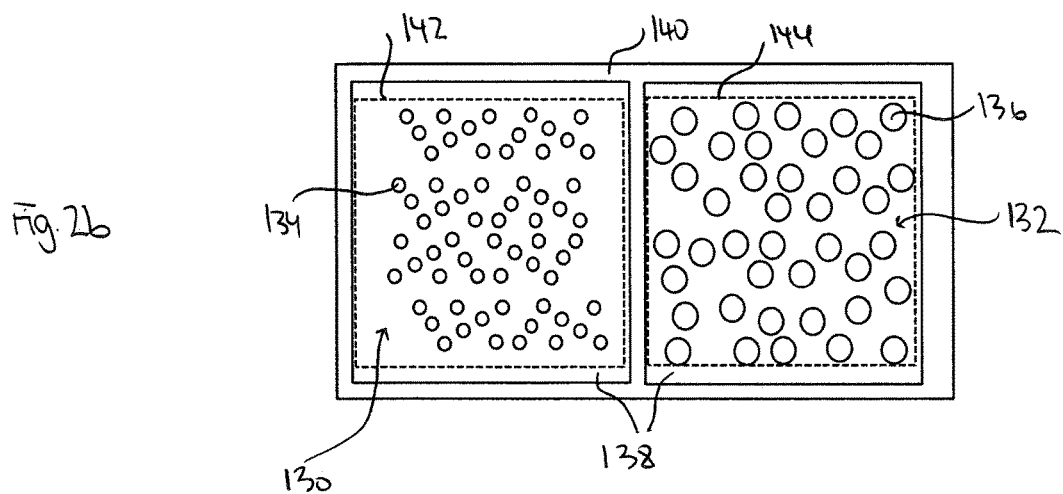
Figure 2C:
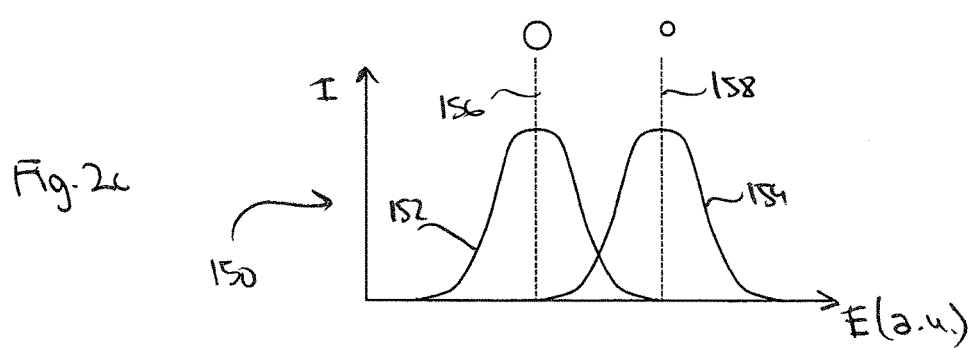

There are shown in:

FIGS. 1$a$ to 1$c$ an embodiment of a first measuring system and its characteristics;

FIGS. 2a to 2c an embodiment of a further embodiment example and its characteristics;

FIGS. 3a to 3d further embodiment examples of a measuring system;

FIGS. 4a and 4b a measuring system with an absorption segment and numerous emission segments;

FIGS. 5a and 5b a measuring system with an emission segment and a multitude of absorption segments;

FIGS. 6a to 6c an embodiment example of a foldable measuring system.

A first embodiment example of a measuring system and its characteristics are represented by way of FIGS. 1.

Figure 1B:
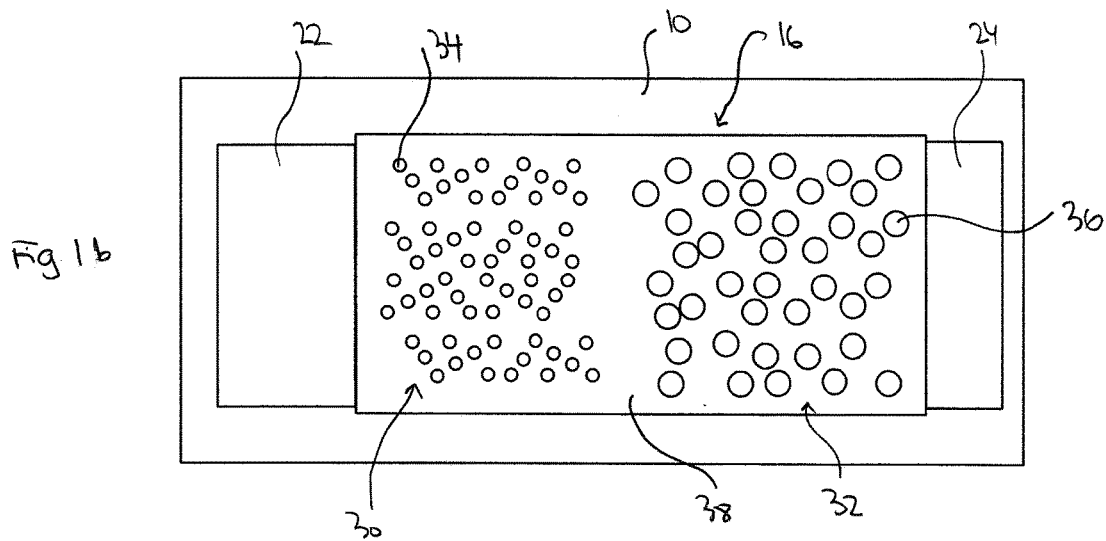

FIG. 1a shows a measuring system, which is constructed in a sandwich construction manner. The measuring system 1 comprises a substrate 10 which is optically transparent. The substrate can be manufactured for example from PMMA, glass or an optically transparent semiconductor. In the present embodiment example, the substrate 10 is rigid and has a base area of 25 mm×25 mm with a height of less than 1 mm, preferably less than 100 μm. A hole injection layer 12 which is constructed from PEDOT:PSS is deposited on the substrate 10. A hole transport layer 14 is arranged on the hole injection layer 12. The quantum dot layer 16 which is explained in yet more detail by way of FIG. 1b, is located above the hole transport layer 14. The hole blocking layer 18, on which in turn an electron transport layer 20 is located, is located above the quantum dot layer 16. Anodes 22 and 24, onto which a control voltage can be applied, are located on the substrate. The cathode 46 which corresponds to these is deposited on the electrode transport layer. The anode and cathode can herein be arranged as a metallisation on the substrate and on the above-mentioned layer respectively. It is evident that the measuring system is constructed layer by layer in a sandwich construction manner. The individual methods for depositing the layers are selected in a manner depending on the selected materials.

A section through the quantum dot layer 16 is represented in FIG. 1b. The quantum dot layer 16 comprises an emission segment 30 and an absorption segment 32. The emission segment 30 comprises a first multitude of quantum dots 34 which with regard to the average or mean are smaller than a second multitude of quantum dots 36 of the absorption segment 32. The emission segment 30 and the absorption segment 32 are each coherent, as can be recognised by way of FIG. 1b, but the segments are essentially adjacent one another, which is to say an intermediately lying zone of the quantum dot layer which is free of quantum dots has a width of approx. 5% of the width of the emission or absorption segment. The respective segments can significantly differ from one another. The segments 30 and 32 are moreover arranged next to one another, considered in a plane 11 of the substrate 10 (as is represented in FIG. 1b). A section free of quantum dots is located between the segments 30 and 32, so that the segments are spatially distanced to one another.

The quantum dots 34 or 36 are embedded into a matrix 38. In the present example, the quantum dots 34 and 36 are manufactured from the same material, such as CdS for example. This means that the quantum dots 34 and 36 differ only with regard to the average of the size. This is illustrated by the different size of the drawn quantum dots 34 and 36. It can be further recognised by way of FIG. 1b that the anode 22 is applied for activating the emission segment 30, and the anode 24 for activating the absorption segment 32. Moreover, one can recognise that the quantum dot layer 16 is arranged on the substrate essentially as a uniform layer. The anodes 22 and 24 are electrically isolated from one another in some embodiments, so that the segments 30 and 31 can be controlled simultaneously with different voltages.

The energy in qualitative units (arbitrary units; a.u) is plotted on the abscissa in the graph 50. A detail concerning the radiation or absorption intensity of the quantum dot multitude is located on the ordinate. The energy distribution 52 with regard to the shape corresponds essentially to the size distribution of the quantum dots 36 of the absorption segment 32. An average energy gap 56 of the absorption segment 32 results from the energy distribution 52, and this is smaller than the average energy gap 58 of the energy distribution 54 corresponding to the size distribution of the quantum dots 34 of the emission segment 30. Looking at the distribution, it is evident that the width of the energy and size distributions is selected such that the two energy distributions only insignificantly overlap one another, if at all. However, the width of the energy distribution can be varied in other embodiment examples, in order to create certain characteristics of the radiation to be emitted and/or of the radiation to be absorbed.

If a suitable control voltage is now applied between the anode 22 and the cathode 26, then the emission segment 30, on account of the excitation of the quantum dots 34, produces a radiation 60 whose energy distribution corresponds essentially to the energy distribution 54. The emitted radiation can be reflected for example at an object 70 and thus be scattered back into the measuring system. The scattered-back radiation 80 can herein be absorbed by the absorption element 32, since the average energy gap of this absorption segment is smaller than the average energy gap of the emission segment. The reflected radiation 80 leads to the production of electron hole pairs in the quantum dot layer, and these electron hole pairs can be detected by way of applying a suitable control voltage between the cathode 26 and the anode 24.

A further embodiment example of a measuring system is shown in the FIGS. 2a to 2c. The measuring system 100 of FIG. 2a comprises a substrate 110 which is constructed of a non-transparent plastic. A hole injection layer 112, a hole transport layer 114, a quantum dot layer 116, a hole blocking layer 118 as well as an electron transport layer 120 are located on the substrate 110 essentially with the similar sequence as with the measuring system 1. The thickness of the individual layers can herein be between 1 nm and 1000 nm.

The quantum dot layer 116, which is represented in cross section in FIG. 2b, apart from the emission segment 130 and the absorption segment 132, comprises an optically isolating layer 140. This is realised by a metallisation in the present example. The optically isolating layer 140 prevents radiation which is emitted by the quantum dots 134 of the emission segment 130 from being able to be scattered directly into the absorption segment 132. The operating manner of the measuring system is improved by way of this, since most radiation which is detectable by the absorption segment 132 has been reflected by a body which has been subjected to the emitted radiation.

The measuring system 100, apart from the optically isolating layer 140 comprises a cathode 126 which is segmented. The cathode segments 142 and 144 are herein designed electrically separated from one another. A cathode material which is optically transparent in the region of the emitted radiation or radiation to be absorbed is moreover selected. ITO is to be mentioned as an example of such a material.

If apart from the cathode, the anode is also segmented, then the control voltage in the emission segment can be varied independently of the control voltage of the absorption segment in a particularly suitable manner. The control voltage of the emission segment and of the absorption segment in particular can be changed simultaneously, but independently of one another. One can also use separate electrodes alternatively to segmentation or to a structuring of an individual electrode layer into several anodes or cathodes.

A graph representing the energy in a.u. on the abscissa and the intensity of the emitted and absorbed radiation on the ordinate is represented in FIG. 2c. The energy distribution 152 corresponds essentially to a size distribution of the quantum dots 136 of the absorption segment 132. The size distribution of the quantum dots 136 in the embodiment example of FIG. 2 results in a wider Gaussian distribution compared to the embodiment example of FIG. 1. The average energy gap of the absorption segment 156 is herein arranged at the maximum of the distribution. The energy distribution 154 corresponds essentially to the size distribution of the quantum dots 134 of the emission segment 130 and has an intensity maximum in the region of the average energy gap 158. The average energy gaps of the respective segment can be clearly separated from one another despite the fact that the two energy distributions 152 and 154 overlap. It can be clearly recognised that the energy gap of the absorption segment is smaller than the energy gap 158 of the emission segment, and this can also be measured.

Figure 1C:
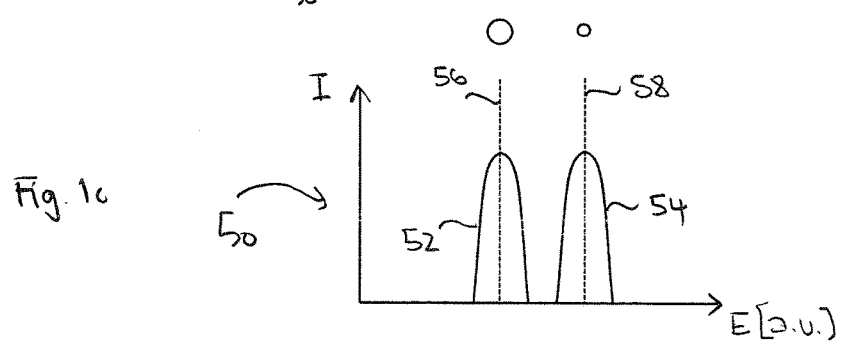

Here, it is to be mentioned that the emission segment and the absorption segment need not have identical energy distributions. Thus the absorption segment for example can be selected in a manner that the energy distribution 152 arises whereas the emission segment 130 is configured in a manner such that an energy distribution 54 as is represented in FIG. 1c results. Different characteristics can be analysed on account of the width of the energy distribution. Thus for example a wider energy distribution in the absorption segment effects an improved detection of the emitted radiation over a wider frequency range.

Figure 3A:
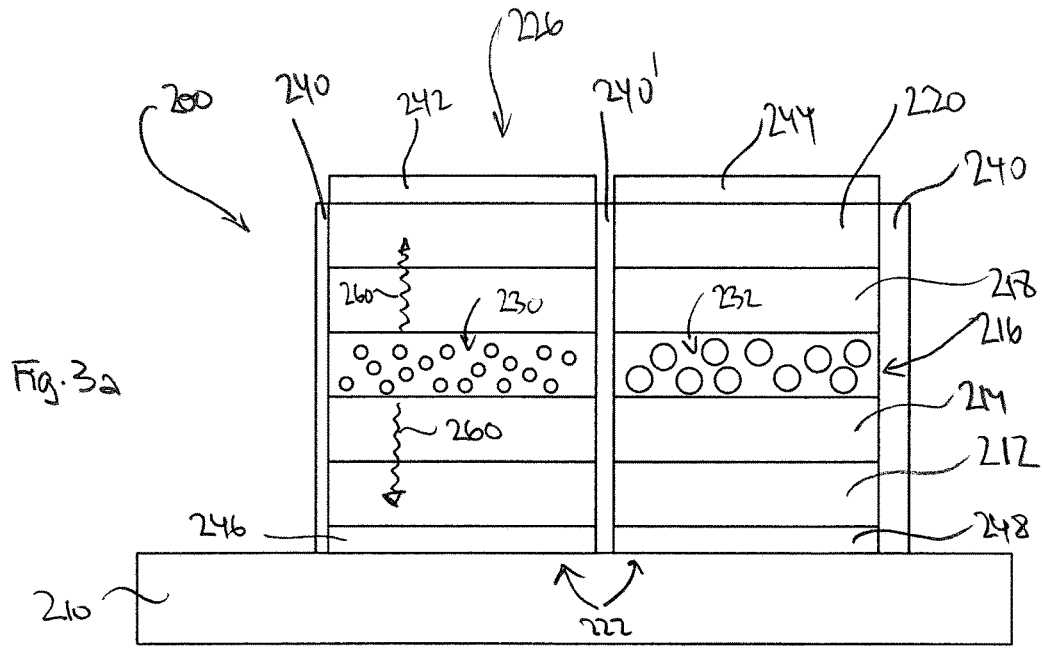

Further embodiments of measuring systems are to be explained by way of FIGS. 3a to 3d. A measuring system 200 which with regard to the layer construction corresponds essentially to the measuring system 1 and 100 is represented in FIG. 3a. The measuring system 200 however is different in that the substrate 210 is transparent and the anode 222 arranged directly on the substrate is segmented, so that an anode segment 246 and an anode segment 248 are present, wherein these are both electrically isolated from one another. A hole injection layer 212, a hole transport layer 214, a quantum dot layer 216, a hole blocking layer 218 as well as an electrode transport layer 220 are located on the anode. An optically isolating layer 240 runs through all the layers and between the layers from the top to the bottom, crossing through the stack. Herein, the optically isolating layer 240 for example is a non-transparent plastic. Although the optically isolating layer surrounds the emission segment or the absorption segment in the manner of a frame, in some embodiment examples however one envisages the optically isolating layer only encompassing the segment 140' or 240'.

A segmented cathode 226 with cathode segments 242 and 244 is arranged on the electron transport layer. It can be recognised that the optically isolating layers running transversely through the stack prevent radiation emitted by the emission segment 230 from being able to be reflected within the sandwich structure onto the absorption segment 323. By way of this one avoids radiation reflections at the individual layers leading to an adulteration of the measuring result. In the present example, not only is the substrate 210 and the anode 222 optically transparent, but also the cathode 226. The radiation can be emitted upwards as well as downwards in this manner.

Figure 3B:
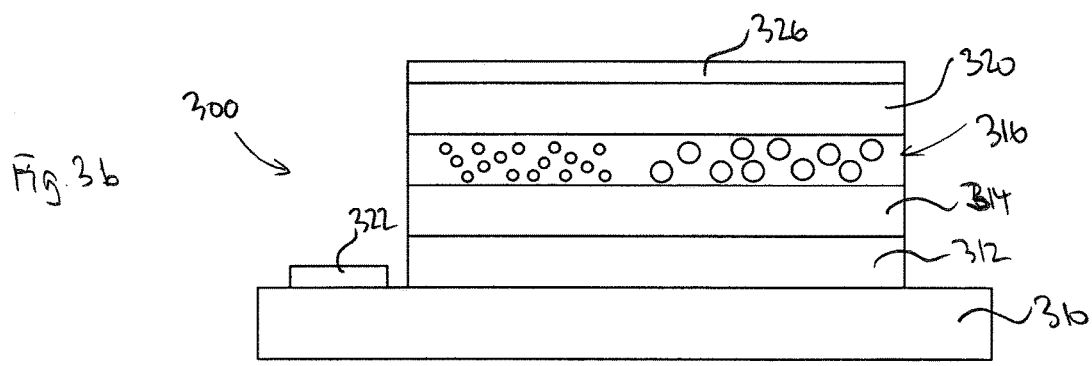
Figure 3C:
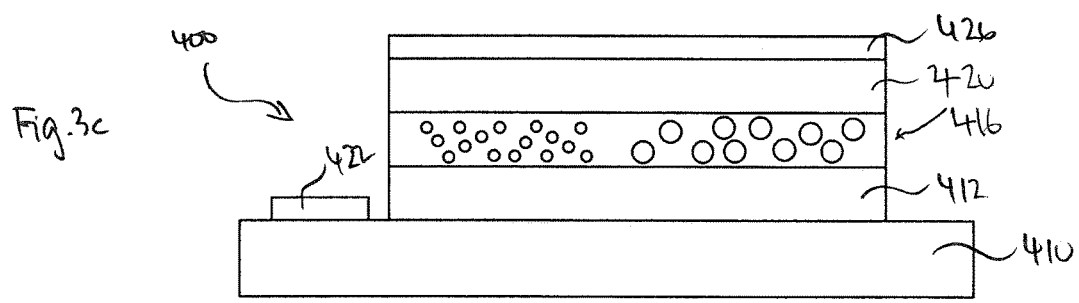
Figure 3D:
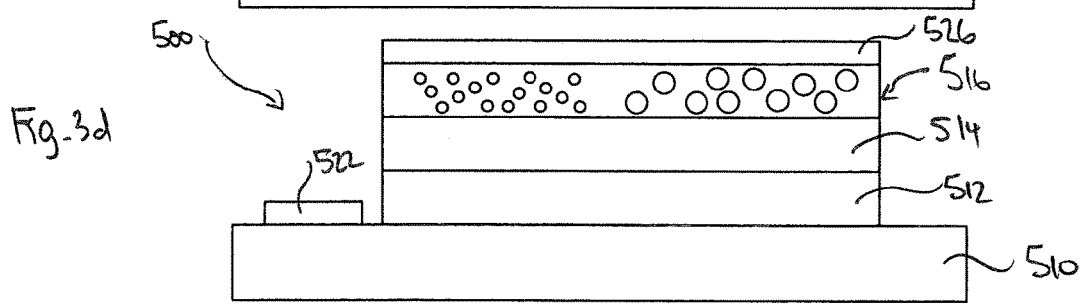

Further embodiments of measuring systems are represented in FIGS. 3b to 3d. Here, the optically isolating layers or anodes and cathode structures are not to be dealt with in more detail, and the already mentioned variants are referred to.

The measuring system 300 of FIG. 3b shows a substrate 310 with a hole injection layer 312 which is arranged therein, a hole transport layer 314 as well as a quantum dot layer 316, on which an electron transport layer 320 is arranged. A hole blocking layer is not provided, which is to say that the task of a hole blocking layer is fulfilled by the matrix material of the quantum dot layer.

The measuring system 400 of FIG. 3c shows a substrate 410 with a hole injection layer 412 and with a quantum dot layer 416 which is arranged thereon, wherein the matrix material of the quantum dot layer at the same time assumes the function of a hole transport layer. An electrode transport layer 420 is arranged on the hole transport layer or quantum dot layer.

The measuring system 500 of FIG. 3d, analogously comprises a substrate 510, a hole injection layer 512, a hole transport layer 514, as well as a quantum dot layer 516 comprising a matrix material, said material also serving as an electron transport layer.

Although the material of the quantum dots in the absorption segment and in the emission segment was the same and the average energy gap of the respective segment was defined by way of the different size distributions of the quantum dots of the absorption segment or emission segment in the embodiment examples which have been discussed until now, in further embodiment examples one can also envisage the energy gap not being set via the size distribution of the material, but via the characteristics of the material. Thus for example one can envisage the quantum dots of the emission segment consisting of a first material, for example CdSe, and the quantum dots of the absorption segment consisting of a second material, for example PbS. herein, the sizes of the quantum dots of the emission and absorption segment are distributed in an essentially equal manner. However, different energy distributions, as are represented in the graphs 50 or 150 for example, are defined on account of the different characteristics of the materials, so that a measuring system can also be constructed with such a system.

The variants of the measuring system which are suggested here can be manufactured by way of simple manufacturing methods. Thus for example all layers can be spin-coated, vapour deposited, punched or printed which is to say sprayed. The measuring system can be manufactured rapidly and inexpensively in a particularly simple way and manner due to the fact that the respective layers for example consist of a uniform material and the next layer is deposited onto the further layer, and the fact that it is only the size distribution or the material of the emission and/or absorption spectrum or example which need to be changed.

Further embodiments of measuring system are to be explained by way of FIGS. 4 to 6. Here, the construction of the individual stacks is no longer discussed, but a stack construction, as explained for example in the embodiment examples of FIGS. 1 to 3 can be used.

The measuring system 600 comprises a substrate and emission segments 630 and 631 which are arranged on the substrate, as well as an absorption segment 632 arranged in the centre of the emission segment 630. Herein, the intermediate spaces between the individual absorption segments and/or emission segments can be filled for example with an optically non-transparent material, or the absorption and emission segments are (within a plane of the substrate for example) spatially separated from one another such that a scatter effect is quite low. The emission segments 630 do not differ from one another. The emission segments 631, in comparison to the emission segments 630, either have a different quantum dot material or a size distribution which is different to the size distribution of the quantum dots of the same material of the emission segment 630. This is illustrated by way of example in the graph 650 of FIG. 4b. The energy distribution 652 corresponds to the size distribution of the quantum dots in the absorption segment 632. An average energy gap 656 results from this. The emission segments 630 have an energy distribution 654 with an energy gap 658. The emission segments 631 have an energy distribution 655 with an energy gap 659. The emission segment 31 for example can therefore be configured in a manner such that it radiates with green visible light, and the emission segment 630 configured in a manner such that it radiates with red visible light, and the absorption segment 632 can be set in a manner such that its average energy gap lies in the near infrared region.

Other arrangements of emission segments can also be selected in the measuring system 600. The emission segments are arranged about the absorption segment in an essentially rotationally symmetrical manner in the represented embodiment example. However, more than six or less than six emission segments can also be applied (such as three emission segments for example). Moreover, more than one absorption segment can also be arranged in the centre of the rotationally symmetrically arranged emission segments.

The measuring system 700 which is illustrated in FIG. 5 comprises a substrate 710 and an emission segment 730 which is arranged thereon, as well as an absorption segment 732 which is to be used for the measurement of emitted radiation of the emission segment 730 which is reflected by a body, as well as reference segments 733 and 733', wherein the absorption segment 733 measures the spectral light power of the emission segment 730, and the absorption segment 733' has the task of determining the central wavelength of the emission segment 730. This is illustrated by the different energy distributions 752 and 753. One can recognise that the energy distributions 752 and 753 differ in the average energy gap 756 and 757 as well as in the FWHM. The energy distribution 753 overlaps the energy distributions 752 and 753', whereas the energy distributions 752, 753' and 754 are each essentially disjunct from one another, i.e. overlap one another only in edges. The size of the FWHM of the energy distribution 753 is comparable to the distance of the average energy gaps 756 and 757, or 757 and 757', whereas the size of the FWHM of the energy distribution 752 differs from the distance of the average energy gaps 756 and 757' or 758 by a multiple. Although the energy distributions 752, 753' and 754 are fashioned equally in the graph 750 of FIG. 5b, these energy distributions can be adapted and can be changed for example in their width, in accordance with the respective task of the absorption and emission element. In the example of the measuring system 700 (or of each other one of the measuring system described in the application), the average energy gaps of the energy distributions 752 and 753 can lie in the visible region for example, whereas the average energy distributions of the energy distributions 753' and 754 can lie in the near infrared. Moreover, all average energy gaps can lie in the visible or near infrared in other embodiments. Average energy gaps in the soft UV region can also be applied.

A further embodiment example of a measuring system is to be found in FIG. 6. The measuring system 800 comprises an emission segment 830, an absorption segment 832 and an absorption segment 833, and these are arranged on a substrate 810. The substrate with the layer stacks which are arranged thereon and which comprise the emission segment and absorption segment is represented in FIG. 6b. The substrate 810 is flexible which is to say can be bent, for example under the effect of heat. In this manner, it can be brought into the configuration represented in FIG. 6c. The segments are spatially separated from one another within the plane of the substrate.

If the emission segment 830 is now configured in a manner such that it can beam or irradiate to the top and to the bottom, then the absorption segment 833 receives radiation directly from the emission segment 830, without a significant component of radiation reflected by a body being added. The absorption segment 832 which can be optically separated from the emission segment 830 by an optically non-transparent layer, can however receive radiation which is only reflected by a body and which was emitted by the emission segment 830. Characteristics of the body can be determined from the signals which are measured in the absorption segments 832 and 833, which is to say at their cathode-anode pairs.

It is to be noted that the embodiment examples which are represented here merely serve for illustrating the measuring system according to the invention and further variants are also encompassed by the invention.

The invention claimed is:

1. A measuring system, comprising:
a substrate with a quantum dot layer which is arranged on the substrate and which comprises an emission segment with a first multitude of quantum dots, and the first multitude has an average first energy gap, wherein the first multitude is configured to emit a radiation corresponding to the average first energy gap, wherein
the quantum dot layer comprises at least one separate and distinct absorption segment with a second multitude of quantum dots, the second multitude of quantum dots of the absorption segment laterally displaced from the first multitude of quantum dots of the emission segment within the same plane, in a plan view looking toward the substrate from above, and the second multitude has an average second energy gap which is smaller than the average first energy gap, so that radiation emitted by the emission segment toward a separate external object via a first side with respect to the substrate, after interaction with the external object, able to be received via the first side and absorbed by the laterally displaced absorption segment.

2. The measuring system according to claim 1, wherein an optically isolating layer is present between the emission segment and the absorption segment, so that radiation which is emitted by the emission segment cannot be emitted directly into the absorption segment.

3. The measuring system according to claim 1, wherein the emission segment and the absorption segment are spatially separated from one another.

4. The measuring system according to claim 1, wherein the quantum dot layer comprises a matrix of organic or inorganic, conducting or semiconducting material, into which the quantum dots are embedded.

5. The measuring system according to claim 1, wherein at least one charge transport layer is present, and the quantum dot layer is integrated into the charge transport layer.

6. The measuring system according to claim 1, wherein the quantum dot layer is arranged between two charge transport layers.

7. The measuring system according to claim 1, wherein a hole injection layer and/or a hole blocking layer is present.

8. The measuring system according to claim 1, wherein a cathode and an anode are present, and at least one of the cathode and/or anode is structured such that the emission segment and the absorption segment are electrically controllable separately from one another.

9. The measuring system according to claim 1, wherein the quantum dots of the emission segment and of the absorption segment are constructed of an equal material or an equal material composition, and the emission segment has a size distribution of quantum dots which is different to the absorption segment.

10. The measuring system according to claim 1, wherein the quantum dots of the emission segment are constructed of a first material and the quantum dots of the absorption segment are constructed of a second material.

11. The measuring system according to claim 1, wherein the quantum dot layer comprises at least one further emission segment with an average third energy gap, and the average third energy gap is larger than the average second energy gap of the absorption segment, so that radiation emitted by the at least one further emission segment is able to be absorbed by the absorption segment.

12. The measuring system according to claim 11, wherein the average first energy gap is different to the average third energy gap.

13. The measuring system according to claim 1, wherein the quantum dot layer comprises a further absorption segment with an average fourth energy gap, and the average fourth energy gap is smaller than or equal to the average second energy gap.

14. The measuring system according to claim 1, wherein the substrate and/or an anode and/or a cathode is optically transparent in the region of the emitted radiation.

15. The measuring system according to claim 1, wherein the substrate is flexible and/or foldable.

16. The measuring system according to claim 1, comprising an emission segment anode located between the emission segment and the substrate.

17. The measuring system according to claim 1, comprising an absorption segment anode located between the absorption segment and the substrate.

18. The measuring system according to claim 1, comprising an emission segment anode that is electrically isolated from an absorption segment anode.

19. The measuring system according to claim 1, comprising an optically isolating region extending through multiple layers of stack structure to the substrate, the optically isolating region located between an emissions segment and an absorption segment.

20. The measuring system according to claim 1, comprising an optically isolating region laterally surrounding at least one of an emissions segment or an absorption segment.

* * * * *